US012537507B2

(12) United States Patent
Omura

(10) Patent No.: US 12,537,507 B2
(45) Date of Patent: Jan. 27, 2026

(54) ACOUSTIC WAVE DEVICE

(71) Applicant: Murata Manufacturing Co., Ltd., Nagaokakyo (JP)

(72) Inventor: Masashi Omura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 376 days.

(21) Appl. No.: 18/295,856

(22) Filed: Apr. 5, 2023

(65) Prior Publication Data

US 2023/0275568 A1 Aug. 31, 2023

Related U.S. Application Data

(63) Continuation of application No. PCT/JP2021/037878, filed on Oct. 13, 2021.

(30) Foreign Application Priority Data

Oct. 14, 2020 (JP) ................... 2020-173406

(51) Int. Cl.
*H03H 9/205* (2006.01)
*H03H 9/02* (2006.01)
(Continued)

(52) U.S. Cl.
CPC ........ *H03H 9/205* (2013.01); *H03H 9/02015* (2013.01); *H03H 9/132* (2013.01); *H03H 9/568* (2013.01)

(58) Field of Classification Search
CPC .... H03H 9/205; H03H 9/02015; H03H 9/132; H03H 9/568; H03H 9/174; H03H 9/02157; H03H 9/173; H03H 9/175
(Continued)

(56) References Cited

U.S. PATENT DOCUMENTS 6,909,340 B2 6/2005 Aigner et al.
2019/0341903 A1\* 11/2019 Kim .................. H03H 9/02157

FOREIGN PATENT DOCUMENTS

JP 2007-227998 A 9/2007
JP 2007-228340 A 9/2007
(Continued)

OTHER PUBLICATIONS

Machine English Translation of WO2012026157A1 Published On Mar. 2012 (Year: 2012).\*
(Continued)

*Primary Examiner* — Jorge L Salazar, Jr.
(74) *Attorney, Agent, or Firm* — XSENSUS LLP

(57) ABSTRACT

An acoustic wave device includes a substrate, first and second resonators above the substrate, and an energy confinement portion. The first resonator includes a first piezoelectric film including a first main surface facing a second main surface, both having anisotropy. First and second electrodes are provided on the first or second main surface. The second resonator includes a second piezoelectric film including a third main surface facing a fourth main surface, both having anisotropy. Third and fourth electrodes are provided on the third or fourth main surface. In the first resonator, a first excitation portion is where the first and second electrodes overlap or where the first electrode faces the second electrode. In the second resonator, a second excitation portion is where the third and fourth electrodes overlap or where the third electrode faces the fourth electrode. The first and second excitation portions have shapes including length directions that differ.

20 Claims, 11 Drawing Sheets

(51) Int. Cl.
*H03H 9/13* (2006.01)
*H03H 9/56* (2006.01)

(58) Field of Classification Search
USPC .................................. 333/186–188
See application file for complete search history.

(56) References Cited

FOREIGN PATENT DOCUMENTS

| | | |
|---|---|---|
| JP | 2008-244943 A | 10/2008 |
| JP | 2012-049758 A | 3/2012 |
| JP | 2014-042330 A | 3/2014 |
| JP | 2017-208711 A | 11/2017 |
| JP | 2019-009671 A | 1/2019 |
| JP | 2020-027987 A | 2/2020 |
| WO | WO-2012026157 A1 * 3/2012 ............. H03H 9/542 |

OTHER PUBLICATIONS

International Search Report and Written Opinion mailed on Jan. 11, 2022, received for PCT Application PCT/JP2021/037878, filed on Oct. 13, 2021, 13 pages including English Translation.

* cited by examiner

ACOUSTIC WAVE DEVICE

This application is a bypass continuation of PCT International Application No. PCT/JP2021/037878, filed Oct. 13, 2021, which claims priority to JP 2020-173406, filed Oct. 14, 2020. The entire contents of both prior applications are hereby incorporated by reference in their entirety.

TECHNICAL FIELD

The present disclosure relates to an acoustic wave device and an acoustic wave filter including a plurality of resonators.

BACKGROUND ART

Acoustic wave devices using bulk waves have been known. For example, Patent Document 1 discloses an acoustic wave filter including a plurality of bulk wave resonators. In this case, a substrate having an air gap opened to the upper surface is used. A plurality of bulk wave resonators is formed on the substrate above the air gap. More specifically, the bulk wave resonator is configured by a piezoelectric film, an upper electrode provided on an upper surface of the piezoelectric film, and a lower electrode overlapping the upper electrode via the piezoelectric film. A plurality of such bulk wave resonators is formed by using the above piezoelectric film.

CITATION LIST

Patent Document

Patent Document 1: U.S. Pat. No. 6,909,340

SUMMARY

Technical Problem

In the acoustic wave device described in Patent Document 1, when a piezoelectric material having anisotropy in which behavior is different in an in-plane direction is used as a piezoelectric film, there is a problem in that ripples appear in filter characteristics.

One aspect of the present disclosure is to provide an acoustic wave device and an acoustic wave filter in which ripples are less likely to occur.

Solution to Problem

An acoustic wave device according to a first aspect of the present disclosure includes a support substrate, first and second resonators provided above the support substrate, and an energy confinement portion provided between the support substrate and the first resonator or between the support substrate and the second resonator. The first resonator includes a first piezoelectric film having first main surface facing a second main surface. The first and second main surfaces have anisotropy. A first electrode is provided on the first main surface or the second main surface of the first piezoelectric film, and a second electrode is provided on the first main surface or the second main surface of the first piezoelectric film. The second resonator includes a second piezoelectric film having third main surface facing a fourth main surface. The third and fourth main surfaces have anisotropy. A third electrode is provided on the third main surface or the fourth main surface of the second piezoelectric film, and a fourth electrode is provided on the third main surface or the fourth main surface of the second piezoelectric film. In the first resonator, a first excitation portion is one of a portion in which the first electrode overlaps the second electrode via the first piezoelectric film and a portion in which the first electrode faces the second electrode on the first main surface or the second main surface. In the second resonator, a second excitation portion is another of a portion in which the third electrode overlaps the fourth electrode via the second piezoelectric film and a portion in which the third electrode faces the fourth electrode face each other on the third main surface or the fourth main surface. The first excitation portion and the second excitation portion each have a shape having a length direction in a plan view, and a length direction of the first excitation portion is different from a length direction of the second excitation portion.

An acoustic wave device according to a second aspect of the present disclosure includes a support substrate, first and second resonators provided above the support substrate, and an energy confinement portion provided between the support substrate and the first resonator or between the support substrate and the second resonator. The first resonator includes a first piezoelectric film having a first main surface facing a second main surface. The first and second main surfaces have anisotropy. A first electrode is provided on the first main surface or the second main surface of the first piezoelectric film, and a second electrode is provided on the first main surface or the second main surface of the first piezoelectric film. The second resonator includes a second piezoelectric film having a third main surface facing a fourth main surface. The third and fourth main surfaces have anisotropy. A third electrode is provided on the third main surface or the fourth main surface of the second piezoelectric film, and a fourth electrode is provided on the third main surface or the fourth main surface of the second piezoelectric film. In the first resonator, a first excitation portion is one of a portion in which the first electrode overlaps the second electrode via the first piezoelectric film and a portion in which the first electrode faces the second electrode on the first main surface or the second main surface. In the second resonator, a second excitation portion is another of a portion in which the third electrode overlaps the fourth electrode via the second piezoelectric film and a portion in which the third electrode faces the fourth electrode on the third main surface or the fourth main surface At least one of a planar shape and an electrode structure of the first excitation portion is different from at least one of a planar shape and an electrode structure of the second excitation portion.

An acoustic wave filter according to the present disclosure includes a plurality of resonators, and at least two resonators among the plurality of resonators are formed of the acoustic wave device configured according to the of the present application.

Advantageous Effects

According to aspects of the present disclosure, it is possible to provide an acoustic wave device and an acoustic wave filter using the acoustic wave device in which ripples are less likely to occur.

DESCRIPTION OF EMBODIMENTS

Hereinafter, exemplary embodiments of the present disclosure will be described with reference to the drawings to clarify the present disclosure.

Note that the exemplary embodiments described in the present specification are merely examples, and partial replacement or combination of configurations is possible between different exemplary embodiments.

Figure 1A:
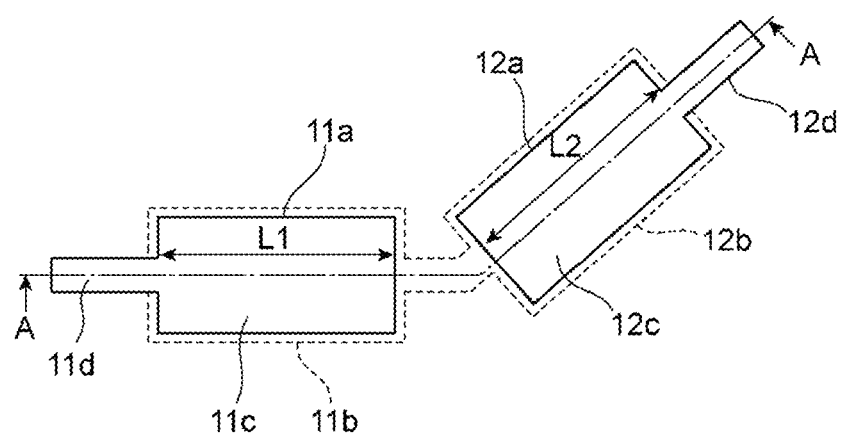
FIG. 1A is a schematic plan view illustrating a main part of an acoustic wave device according to a first exemplary embodiment of the present disclosure.
Figure 1B:
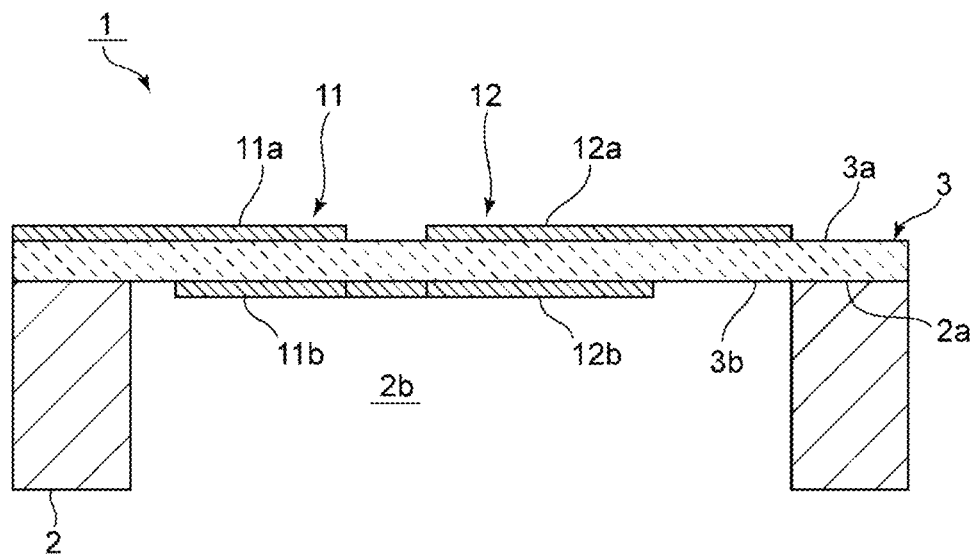
FIG. 1B is a front cross-sectional view of the acoustic wave device according to the first exemplary embodiment of the present disclosure.
Figure 2:
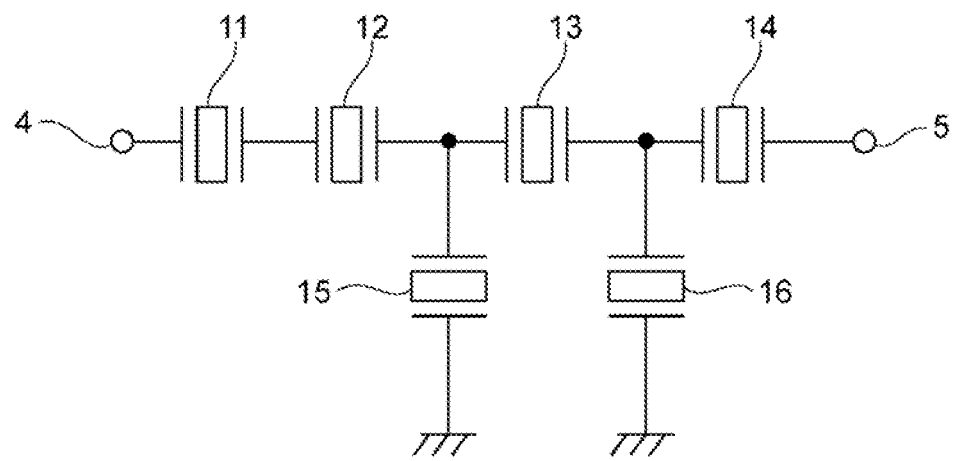
FIG. 2 is a circuit diagram of a ladder filter as an acoustic wave device according to the first exemplary embodiment of the present disclosure.

FIG. 1A is a schematic plan view illustrating a main part of an acoustic wave device according to a first exemplary embodiment of the present disclosure, and FIG. 1B is a front cross-sectional view of the acoustic wave device of the exemplary embodiment. In addition, FIG. 2 is a circuit diagram of the acoustic wave device of the first exemplary embodiment, in which a ladder filter is formed.

As illustrated in FIG. 1B, an acoustic wave device 1 includes a support substrate 2. The support substrate 2 has a through-hole 2b opened to an upper surface 2a. An air gap is formed by the through-hole 2b. A piezoelectric film 3 is laminated on the upper surface 2a of the support substrate 2. The piezoelectric film 3 has anisotropy. As a material of the piezoelectric film 3 like this, a piezoelectric single crystal such as lithium tantalate, lithium niobate or the like can be used as one of ordinary skill would recognize.

The piezoelectric film 3 has a first main surface 3a and a second main surface 3b facing each other. The second main surface 3b is bonded to the upper surface 2a of the support substrate 2.

The piezoelectric film 3 is provided to cover the through-hole 2b. Therefore, the piezoelectric film 3 is in a floating state above the through-hole 2b.

A first resonator 11 and a second resonator 12 are formed in the portion in which the piezoelectric film 3 is floated. The first resonator 11 includes first and second electrodes 11a and 11b. The first electrode 11a is provided on the first main surface 3a of the piezoelectric film 3. The second electrode 11b is provided on the second main surface 3b of the piezoelectric film 3. A region where the first electrode 11a and the second electrode 11b overlap each other via the piezoelectric film 3 is a first excitation portion 11c. In the exemplary embodiment, the first electrode 11a and the second electrode 11b have the same shape and overlap each other via the piezoelectric film 3. However, in FIG. 1A, in order to clearly illustrate that the first electrode 11a and the second electrode 11b overlap each other, the outer peripheral edge of the second electrode 11b is illustrated to be slightly larger than the outer peripheral edge of the first electrode 11a. Hereinafter, in order to clarify the arrangement of the electrodes on the first main surface 3a and the electrodes on the second main surface 3b of the piezoelectric film 3, similarly, the second electrode on the second main surface 3b side is illustrated in an enlarged manner as necessary. Note that the shape of the first electrode 11a and the shape of the second electrode 11b may be different from each other, and the outer peripheral edge of the first electrode 11a may be larger than the outer peripheral edge of the second electrode 11b, or the outer peripheral edge of the first electrode 11a may be smaller than the outer peripheral edge of the second electrode 11b.

Therefore, the first excitation portion 11c has a shape corresponding to the outer peripheral edge of the first electrode 11a indicated by a solid line in FIG. 1A, and has a rectangular shape having a length direction in the exemplary embodiment. Note that a wiring portion 11d is connected to the first electrode 11a.

Figure 19:
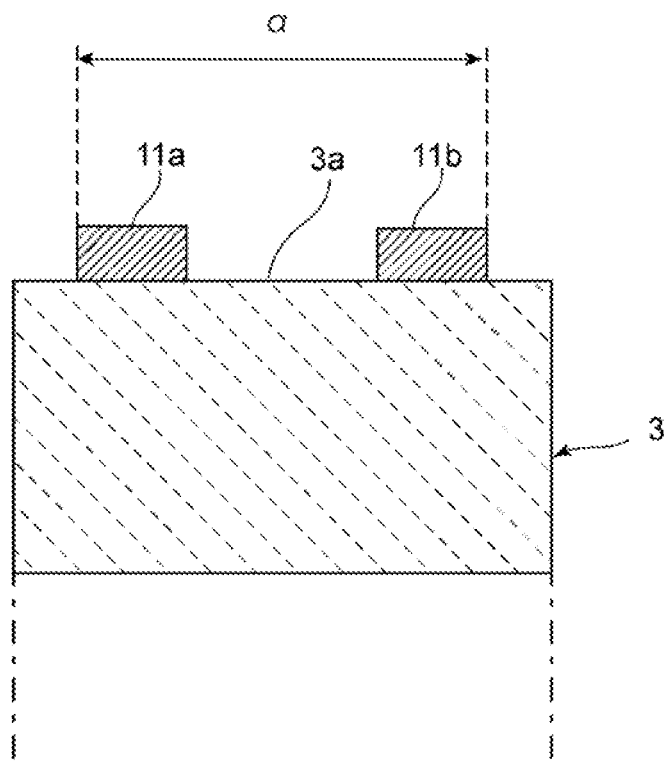
FIG. 19 is a front cross-sectional view of an acoustic wave device according to a modification of the first exemplary embodiment of the present disclosure.

Note that although the first electrode 11a and the second electrode 11b are provided to overlap each other via the piezoelectric film 3 in FIG. 1A, an excitation electrode may be provided on only one of the first main surface 3a and the second main surface 3b of the piezoelectric film 3 in the first excitation portion in the present disclosure. That is, the first and second electrodes as the excitation electrodes may be provided on one main surface. For example, as in a modification example illustrated in FIG. 19, the first and second electrodes 11a and 11b may face each other on the first main surface 3a of the piezoelectric film 3. In this case, a first excitation portion a is a region where the first and second electrodes 11a and 11b face each other.

On the other hand, also in the second resonator 12, a third electrode 12a is provided on the first main surface 3a of the piezoelectric film 3, and a fourth electrode 12b is provided on the second main surface 3b of the piezoelectric film 3. A portion in which the third electrode 12a and the fourth electrode 12b overlap each other via the piezoelectric film 3 serves as a second excitation portion 12c. The planar shape of the second excitation portion 12c is also a rectangle having the length direction.

However, the length direction of the second excitation portion 12c is different from the length direction of the first excitation portion 11c. In the exemplary embodiment, since the length direction of the first excitation portion 11c of the first resonator 11 and the length direction of the second excitation portion 12c of the second resonator 12 are different from each other, ripples that appear in the filter characteristics of the acoustic wave device 1 can be suppressed.

Note that a wiring portion 12d is connected to the third electrode 12a.

The first to fourth electrodes 11a, 11b, 12a, and 12b and the wiring portions 11d and 12d are made of metals such as Au, Al, Mo, W, Pt, Ta, Ti, Ni, Cr, Cu and the like, or alloys mainly containing these metals. Further, they may be formed of laminated metal films obtained by laminating a plurality of metal films.

In the first resonator 11, a bulk wave propagating through the piezoelectric film 3 is excited by applying an AC voltage between the first electrode 11a and the second electrode 11b. Resonance characteristics due to resonance of the bulk wave can be obtained as a characteristic of the first resonator 11. Also on the second resonator 12 side, resonance characteristics due to the excited bulk wave can be obtained. In this case, since the air gap formed by the through-hole 2b is provided below the first and second resonators 11 and 12, the resonance due to the bulk wave is hardly prevented. That is, the through-hole 2b is an energy confinement portion for confining resonance caused by a bulk wave in the piezoelectric film 3.

Although FIG. 1A and FIG. 1B illustrate the portion in which the first and second resonators 11 and 12 are formed, the acoustic wave device 1 of the present embodiment has a circuit configuration illustrated in FIG. 2. As illustrated in FIG. 2, the first resonator 11, the second resonator 12, a third resonator 13, and a fourth resonator 14 are connected in series to each other as series-arm resonators in a series-arm connecting an input terminal 4 and an output terminal 5. In addition, as parallel-arm resonators, a fifth resonator 15 and a sixth resonator 16 are connected between the series-arm and the ground potential. Here, the first and second resonators 11 and 12 are resonators divided in series and connected to each other without a parallel-arm resonator.

Although the above first resonator 11 and the second resonator 12 are connected in series, the filter characteristics of the ladder filter are realized by their resonance characteristics. In the exemplary embodiment, as described above, the piezoelectric film 3 has anisotropy, but the length direction of the first excitation portion 11c in the first resonator 11 is different from the length direction of the second excitation portion 12c in the second resonator 12. Therefore, since the frequency positions and magnitudes of ripples generated by these resonators are different from each other, ripples can be effectively suppressed in the entire filter characteristics of the acoustic wave device 1.

Figure 3:
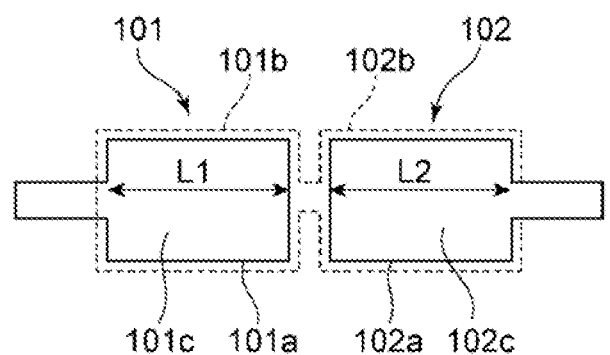
FIG. 3 is a plan view schematically illustrating a portion in which first and second resonators are arranged in an acoustic wave device.

FIG. 3 is a schematic plan view for explaining a portion in which a first resonator 101 and a second resonator 102 are arranged in an acoustic wave device. In the first resonator 101, a first excitation portion 101c is formed in a portion in which a first electrode 101a and a second electrode 101b overlap each other. In the second resonator 102, a second excitation portion 102c is formed by a portion in which a third electrode 102a and a fourth electrode 102b overlap each other. Here, the length direction of the first excitation portion 101c and the length direction of the second excitation portion 102c are the same direction as indicated by L1 and L2 in the drawing. Note that the case of the same direction includes cases where the angles formed by the length direction L1 and the length direction L2 are both angles of 0° and 180°. Therefore, in the length directions L1 and L2, the first excitation portion 101c and the second excitation portion 102c are configured in the same manner, so the resulting ripples appear at substantially the same position of frequency and have similar magnitude, and may strengthen each other. Therefore, in the acoustic wave device of FIG. 3, ripples tend to occur in filter characteristics and the like of the acoustic wave device including the first and second resonators.

On the other hand, in the exemplary embodiment, as described above, since the length direction L1 of the first excitation portion 11c and the length direction L2 of the second excitation portion 12c are different from each other, ripples are less likely to occur in the filter characteristics as described above.

Figure 4A:
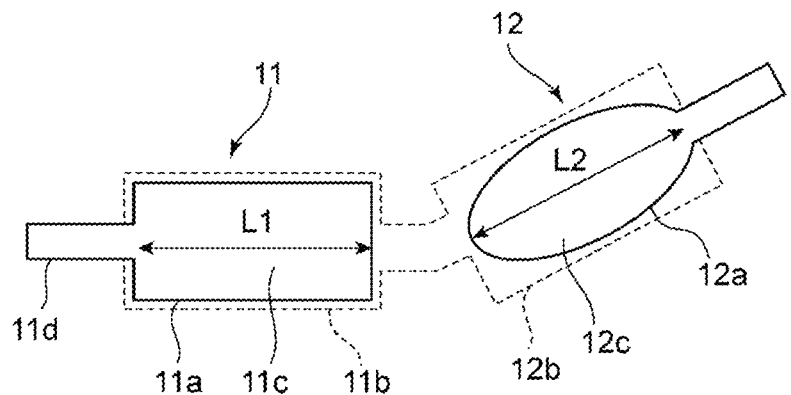
FIG. 4A is a schematic plan view for explaining the first and second resonators in acoustic wave devices according to first and second modifications of the first exemplary embodiment.

FIG. 4A is a schematic plan view for explaining the planar shapes of the first and second resonators in a first modification of the first exemplary embodiment. In the first modification, the first excitation portion 11c in the first resonator 11 is formed in the same manner as the first excitation portion 11c of the above-described exemplary embodiment. On the other hand, in the second resonator 12, the third electrode 12a has an elliptical shape, and therefore, the planar shape of the second excitation portion 12c in which the third electrode 12a and the fourth electrode 12b overlap each other is an elliptical shape.

In addition, the length direction L1 of the first excitation portion 11c and the length direction L2 of the second excitation portion 12c are also different from each other.

Therefore, since the frequency position and the magnitude of the ripple appearing in the resonance characteristics of the first resonator 11 are different from those of the ripple appearing in the resonance characteristics of the second resonator 12, the ripple is less likely to occur in the filter characteristics of the ladder filter also in this modification.

Note that as is apparent from the first modification, not only the length direction L1 of the first excitation portion 11c and the length direction L2 of the second excitation portion 12c are different from each other, but further the planar shape of the first excitation portion 11c and the planar shape of the second excitation portion 12c may be also different from each other.

Figure 4B:
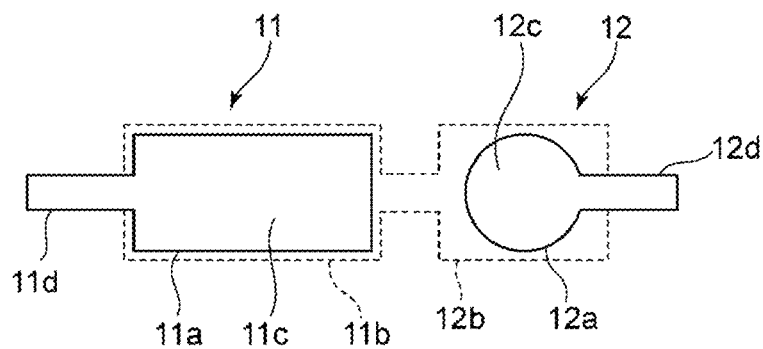
FIG. 4B is another schematic plan view for explaining the first and second resonators in acoustic wave devices according to the first and second modifications of the first exemplary embodiment.

In addition, as in a second modification illustrated in FIG. 4B, the planar shape of the first excitation portion 11c and the planar shape of the second excitation portion 12c may be different from each other.

Note that in the second modification, the third electrode 12a of the second resonator 12 has a circular planar shape. Therefore, the planar shape of the second excitation portion 12c in which the third electrode 12a and the fourth electrode 12b overlap each other is circular. Therefore, the second excitation portion 12c has isotropy because its dimensions are the same regardless of direction since it is circular. In this case, since the planar shapes of the first excitation portion 11c and the second excitation portion 12c are different from each other, the ripple appearing in the resonance characteristics of the first resonators 11 and the ripple appearing in the resonance characteristics of the second resonator 12 can be different from each other in terms of the frequency positions and the magnitudes of the ripples. Therefore, ripples are less likely to occur in the filter characteristics of the acoustic wave device 1.

As described above, in the present disclosure, the length direction of the first excitation portion 11c and the length direction of the second excitation portion 12c may be different from each other, and the planar shape of the first excitation portion 11c and the planar shape of the second excitation portion 12c may be different from each other.

Note that the case of having different planar shapes does not include the case where rectangular planar shapes have different aspect ratios, and refers to the case where plane figures have different shapes. For example, in the case where the number of vertices appearing on the outer peripheral edge of the first excitation portion is different from the number of vertices appearing on the outer peripheral edge of the second excitation portion, cases where the planar shapes are different due to difference other than the aspect ratio, such as the case where one has a shape having no length direction like a circle and the other has a shape having a length direction like a rectangle, the case where one is a rectangle and the other is a parallelogram and the like are widely included. More specifically, examples include, when the outer peripheral edge of the first excitation portion is a combination of straight lines and the outer peripheral edge of the second excitation portion is a combination of curved lines or arcs, the case where in the straight line portion or the curved line portion constituting the outer peripheral edge, one of the first excitation portion and the second excitation portion is provided with a convex portion or a concave portion and the other is provided with a concave portion or a convex portion having a buried shape, or the case where the first excitation portion is provided with a concave portion or a convex portion and the second excitation portion is provided with no concave portion and no convex portion, and the case where at least one of the first and second excitation portions is a polygon in which a chamfered portion or a fillet portion is provided in at least a part of the rectangular shape, in this case, the portion being a circular shape and the like in the first excitation portion and the second excitation portion.

Figure 5A:
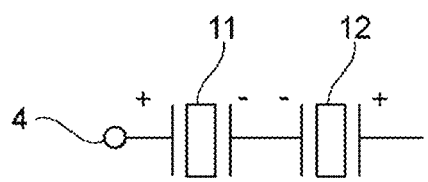
FIG. 5A is a circuit diagram for explaining a polarization axis direction of a portion in which the first and second resonators in the first exemplary embodiment are formed.
Figure 5B:
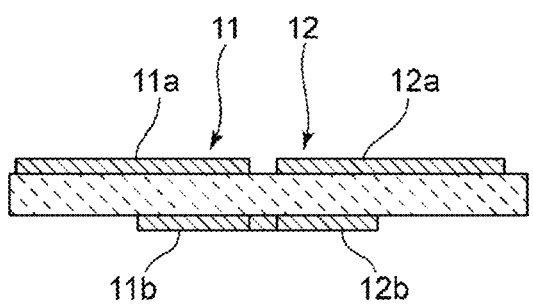
FIG. 5B is a front cross-sectional view for explaining the first and second resonators in the acoustic wave device.

FIG. 5A is a circuit diagram for explaining a polarization axis direction of a portion in which the first and second resonators in the first exemplary embodiment are formed, and FIG. 5B is a front cross-sectional view illustrating the portion in which the first and second resonators are formed. In the first resonator 11 and the second resonator 12, the polarization axes are in opposite directions.

Figure 6A:
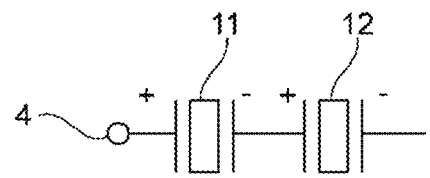
FIG. 6A is a circuit diagram for explaining polarization axis directions of the first and second resonators in a modification of the first exemplary embodiment.
Figure 6B:
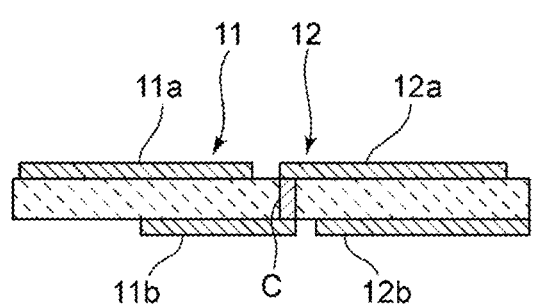
FIG. 6B is a front cross-sectional view for explaining the first and second resonators.

However, as illustrated in FIG. 6A and FIG. 6B, the first resonator 11 and the second resonator 12 may have the same polarization axis direction. In FIG. 6B, the second electrode 11b and the third electrode 12a are connected by a via-hole electrode C. Incidentally, the polarization axis direction in the first resonator 11 is the polarization axis direction of a first piezoelectric film, and the polarization axis direction in the second resonator 12 is the polarization axis direction of a second piezoelectric film. In the first exemplary embodiment, the first piezoelectric film and the second piezoelectric film are the same piezoelectric film 3. Further, a third main surface of the second piezoelectric film in the present disclosure is the first main surface 3a of the piezoelectric film 3, and a fourth main surface of the second piezoelectric film in the present disclosure is the second main surface 3b of the piezoelectric film 3. Note that the first piezoelectric film and the second piezoelectric film may be different piezoelectric films, or may be in different layers.

Figure 7:
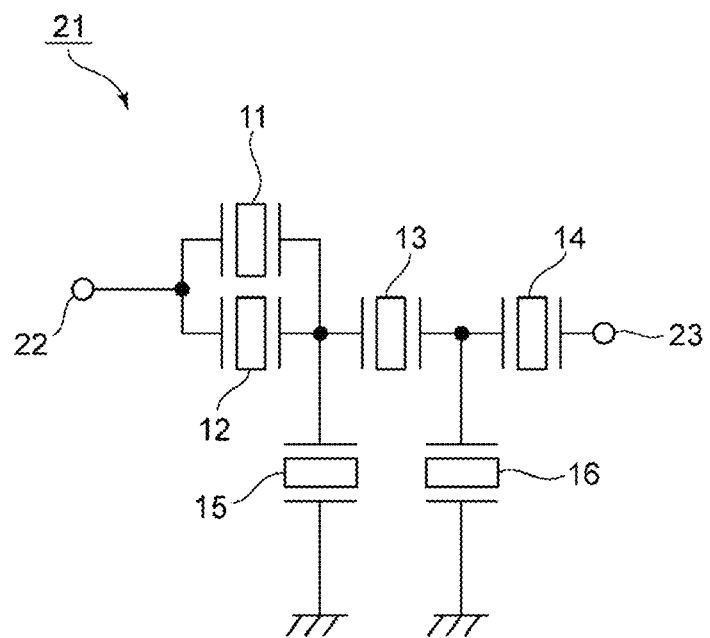
FIG. 7 is a circuit diagram of a ladder filter as a second exemplary embodiment of the present disclosure.

FIG. 7 is a circuit diagram of a ladder filter as a second exemplary embodiment of the present disclosure.

In the ladder filter, the first to fourth resonators 11 to 14 are arranged in a series-arm connecting an input terminal 22 and an output terminal 23. In this example, the first resonator 11 and the second resonator 12 are connected in parallel. The third resonator 13 and the fourth resonator 14 are connected in series with respect to the portion in which the first and second resonators 11 and 12 are connected in parallel. In addition, the fifth resonator 15 and the sixth resonator 16 are arranged as parallel-arm resonators in the first and second parallel-arms, respectively.

The planar shapes of the above first resonator 11 and the second resonator 12 will be described with reference to the schematic plan view of FIG. 8A. In addition, FIG. 8B is a circuit diagram for explaining the polarization axis directions of the first and second resonators 11 and 12.

The first resonator 11 includes the first electrode 11a and the second electrode 11b. As illustrated in FIG. 8A, the first electrode 11a has a rectangular shape whose length direction L1 extends in an oblique direction on the drawing. The second electrode 11b has a larger area than the first electrode 11a. Therefore, the first excitation portion 11c have the same planar shape as that of the first electrode 11a in a plan view.

On the other hand, the second resonator 12 includes the third electrode 12a and the fourth electrode 12b. Here, the length direction L2 of the second excitation portion 12c is a horizontal direction on the drawing. Therefore, the length direction L1 of the first excitation portion 11c is different from the length direction L2 of the second excitation portion 12c.

On the other hand, the second electrode 11b of the first resonator 11 and the third electrode 12a of the second resonator 12 are commonly connected to each other by a wiring portion 24. In addition, the first electrode 11a of the first resonator 11 and the fourth electrode 12b of the second resonator 12 are commonly connected to each other by a wiring portion 25. Therefore, as illustrated in FIG. 8B, the first resonator 11 and the second resonator 12 are connected in parallel. Also in this parallel connection structure, since the length direction L1 of the first excitation portion 11c of the first resonator 11 and the length direction L2 of the second excitation portion 12c are different from each other as described above, the positions of frequencies at which ripples appear and the magnitudes of the ripples can be made different from each other. Therefore, ripples are less likely to occur in the filter characteristics of the whole of an acoustic wave device 21. In this manner, the first resonator 11 and the second resonator 12 may be connected in parallel. Further, the present disclosure may be applied to the first and second resonators in a structure in which one resonator is divided into the first and second resonators in parallel.

Figure 8A:
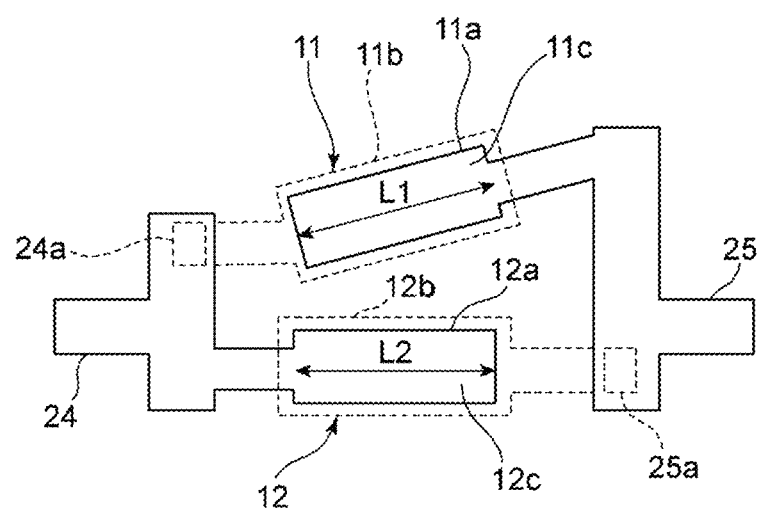
FIG. 8A is a schematic plan view of a portion in which the first and second resonators are formed in the ladder filter of the second exemplary embodiment.
Figure 8B:
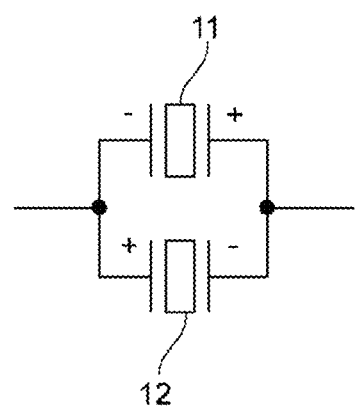
FIG. 8B is a circuit diagram for explaining electrical connection portions and polarization axis directions in the first and second resonators.

In FIG. 8A, the first electrode 11a and the fourth electrode 12b are connected to each other by the wiring portion 25. Note that a connecting portion 25a extends in a thickness direction in the wiring portion 25 and connects a wiring portion connecting to the first electrode 11a and a wiring portion connecting to the fourth electrode 12b. Similarly, the second electrode 11b and the third electrode 12a are electrically connected to each other by the wiring portion 24. The wiring portion 24 also has a connecting portion 24a extending in the thickness direction. Therefore, as illustrated in FIG. 8B, in the first resonator 11 and the second resonator 12, the polarization axis directions of the piezoelectric films are opposite to each other, for example, in the thickness direction. As described above, in the present disclosure, the polarization axis direction of the piezoelectric film in the first resonator 11 and the polarization axis direction of the piezoelectric film in the second resonator 12 may be different from each other. Therefore, also in the first resonator 11 and the second resonator 12 of the first embodiment, by adopting the electrical connection structure illustrated in FIG. 8A, the polarization axis directions of the piezoelectric films may be made different between the first resonator 11 and the second resonator 12 among the plurality of series-arm resonators. In this case, ripples appearing in the filter characteristics are even less likely to occur.

Figure 9A:
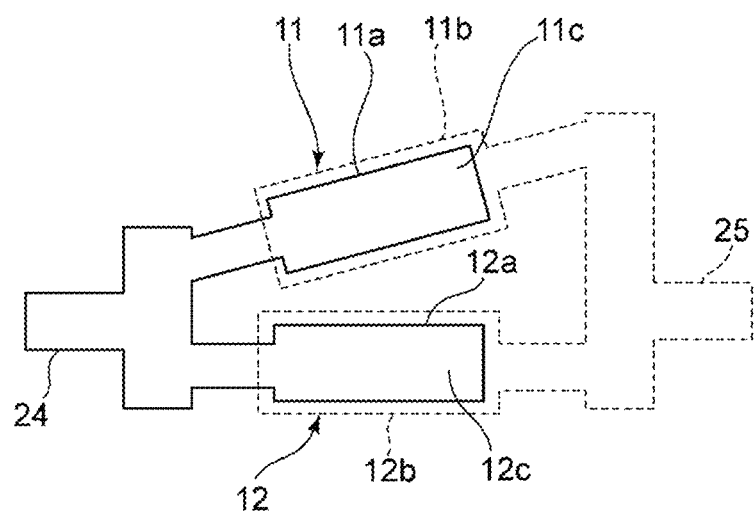
FIG. 9A is a schematic plan view of a portion in which the first and second resonators are formed in an acoustic wave device according to a modification of the second exemplary embodiment.
Figure 9B:
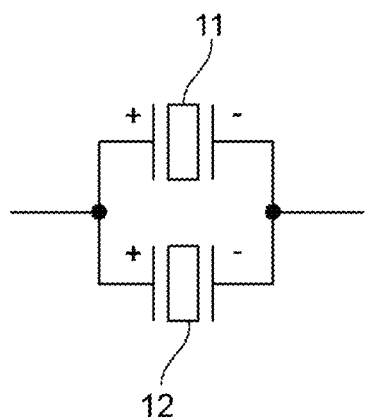
FIG. 9B is a circuit diagram for explaining a portion in which the first and second resonators are connected to each other and polarization axis directions.

Note that in the second exemplary embodiment, the polarization axis directions of the piezoelectric films in the first resonator 11 and the second resonator 12 may be the same. FIG. 9A is a schematic plan view illustrating a portion in which the first and second resonators of such a modification are formed. FIG. 9B is a circuit diagram for explaining the polarization axis direction in this modification.

In the present modification, the first electrode 11a and the third electrode 12a are connected to each other by the wiring portion 24. In addition, the second electrode 11b and the fourth electrode 12b on the lower surface side are connected to each other by the wiring portion 25. As illustrated in FIG. 9B, the polarization axis direction in the first resonator 11 is the same as the polarization axis direction in the second resonator 12. As described above, the polarization axis directions of the first resonator 11 and the second resonator 12 may be the same direction.

Figure 10:
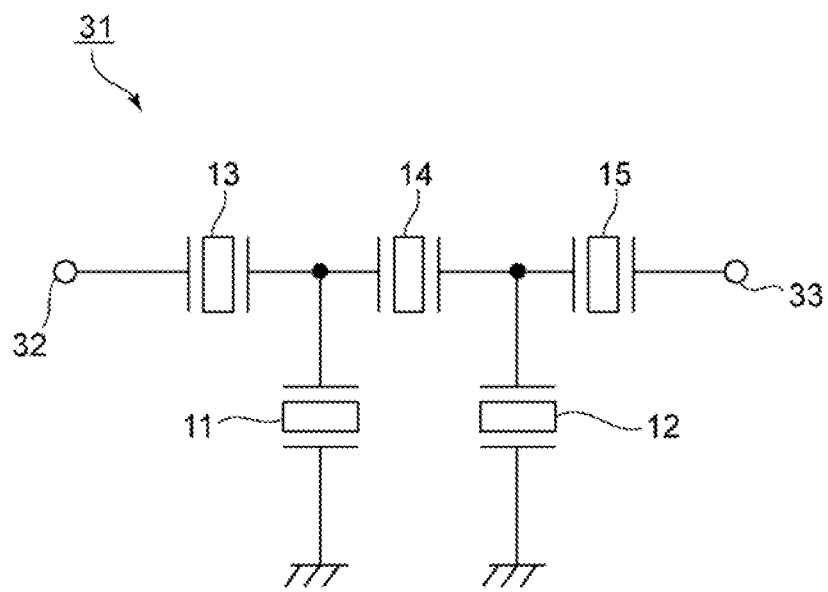
FIG. 10 is a circuit diagram of a ladder filter according to a third exemplary embodiment of the present disclosure.

FIG. 10 is a circuit diagram of a ladder filter according to a third exemplary embodiment of the present disclosure. In an acoustic wave device 31, the plurality of resonators, that is, the ladder filter is configured by the first to fifth resonators 11 to 15. In a series-arm connecting an input terminal 32 and an output terminal 33, the third to fifth resonators 13 to 15 are connected in series to each other. The first resonator 11 is provided in a parallel-arm connecting a connection point between the third resonator 13 and the fourth resonator 14 and the ground potential. The second resonator 12 is provided in a parallel-arm connecting a connection point between the fourth resonator 14 and the fifth resonator 15 and the ground potential. In the acoustic wave device 31, the first resonator 11 and the second resonator 12 are parallel-arm resonators.

Figure 11:
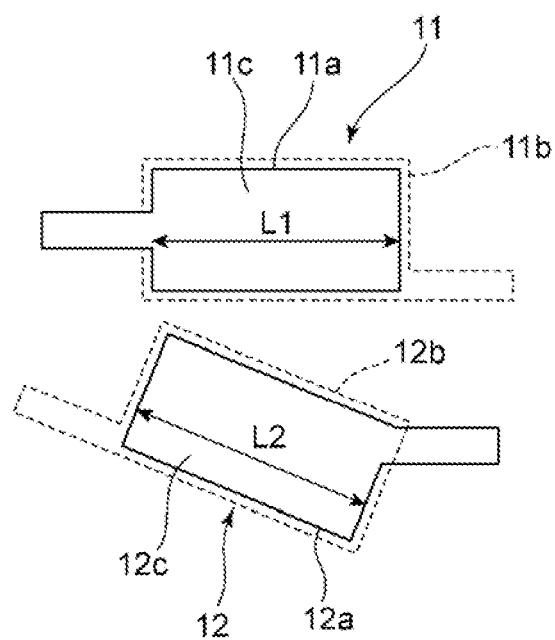
FIG. 11 is a schematic plan view of the first and second resonators used in the ladder filter of the third exemplary embodiment of the present disclosure.

FIG. 11 is a schematic plan view for explaining a portion in which the first resonator 11 and the second resonator 12 are formed in the ladder filter of the third exemplary embodiment. Here, the length direction L1 of the first excitation portion 11c of the first resonator 11 and the length direction L2 of the second excitation portion 12c of the second resonator 12 are different from each other as illustrated in the drawing. Therefore, the frequency positions and magnitudes of ripples appearing in the resonance characteristics of the first resonator 11 and the second resonator 12 as the parallel-arm resonators are different from each other. Accordingly, in the acoustic wave device 31 as well, ripples are less likely to occur in the filter characteristics.

Figure 12:
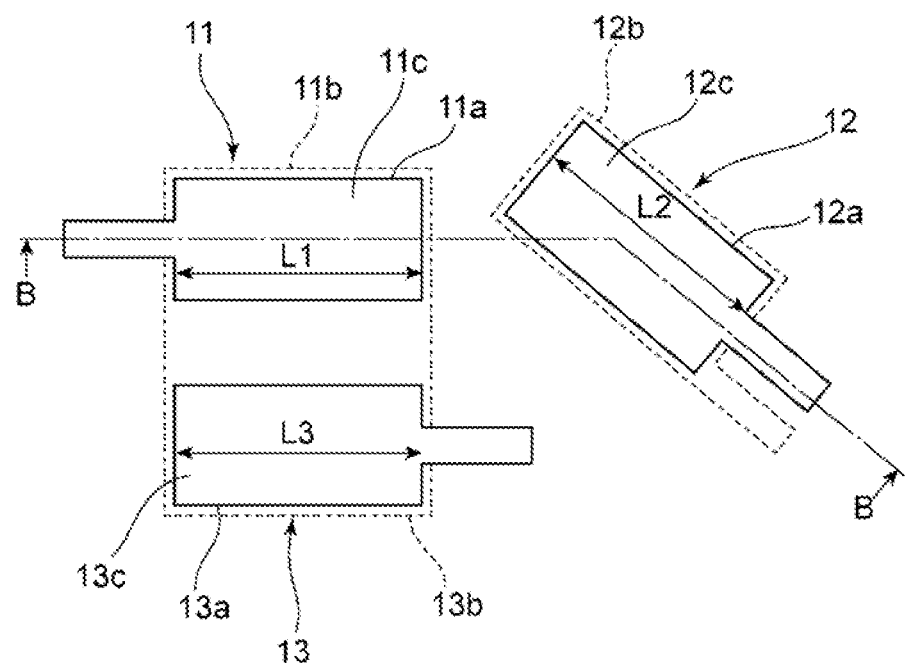
FIG. 12 is a schematic plan view for explaining a plurality of resonators configured in an acoustic wave device according to a fourth exemplary embodiment of the present disclosure.

FIG. 12 is a schematic plan view of a plurality of resonators formed in an acoustic wave device according to a fourth exemplary embodiment. Here, the length directions L1 and L2 of the first and second resonators 11 and 12 are different from each other. In addition, the third resonator 13 has a fifth electrode 13a and a sixth electrode 13b formed on the second main surface 3b of the piezoelectric film 3. In this case, a third excitation portion 13c is a region where the fifth electrode 13a and the sixth electrode 13b overlap each other in a plan view. A length direction L3 of the third excitation portion 13c is different from the length direction L2 of the second excitation portion 12c of the second resonator 12.

The circuit configuration of the acoustic wave device of the fourth exemplary embodiment is the same as that of the acoustic wave device 31 illustrated in FIG. 10. Therefore, while the first and second resonators 11 and 12 are parallel-arm resonators, the third resonator 13 is a series-arm resonator. In this case, the third resonator 13 is different from the second resonator 12 in the length direction of the excitation portion. In the same way, the third to fifth resonators 13 to 15 of the acoustic wave device 31 according to the fourth exemplary embodiment may be made different in the length and the shape of the excitation portion. As such, ripples in the filter characteristics of the acoustic wave device 31 as a ladder filter are even less likely to occur.

In other words, according to the present disclosure, in a ladder filter including a plurality of resonators including a plurality of parallel-arm resonators and a plurality of series-arm resonators, an acoustic wave device including the first and second resonators of the present disclosure in at least two resonators can be formed.

Figure 13:
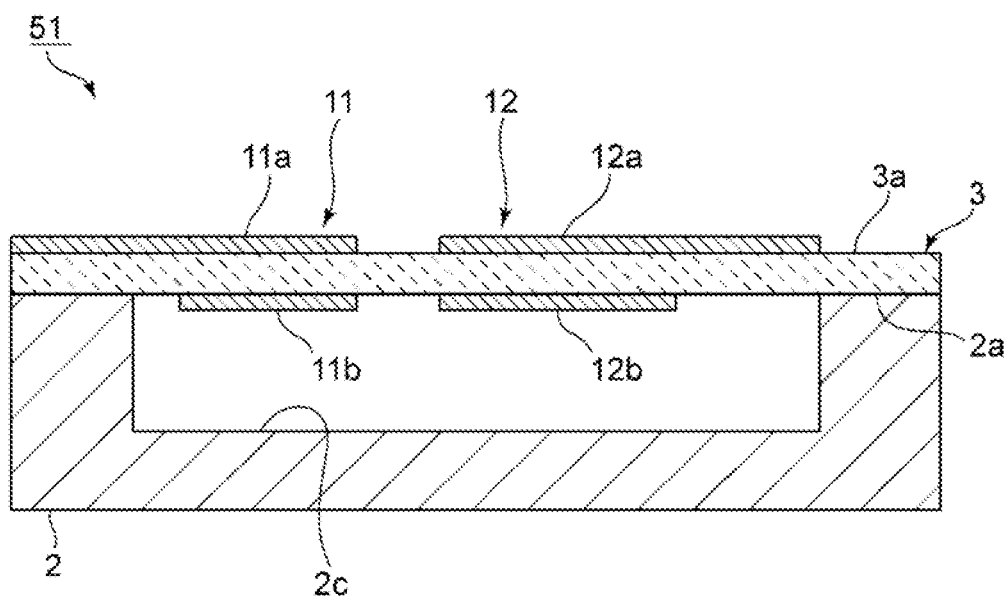
FIG. 13 is a front cross-sectional view of an acoustic wave device according to a fifth exemplary embodiment of the present disclosure.

FIG. 13 is a front cross-sectional view of an acoustic wave device according to a fifth exemplary embodiment of the present disclosure. In an acoustic wave device 51, a concave portion 2c opened to the upper surface of the support substrate 2 is provided. An energy confinement portion is formed by the concave portion 2c. As described above, an air gap constituting the energy confinement portion may be the concave portion 2c opened to the upper surface of the support substrate 2. The other structures of the acoustic wave device 51 are similar to those of the acoustic wave device 1.

Figure 14:
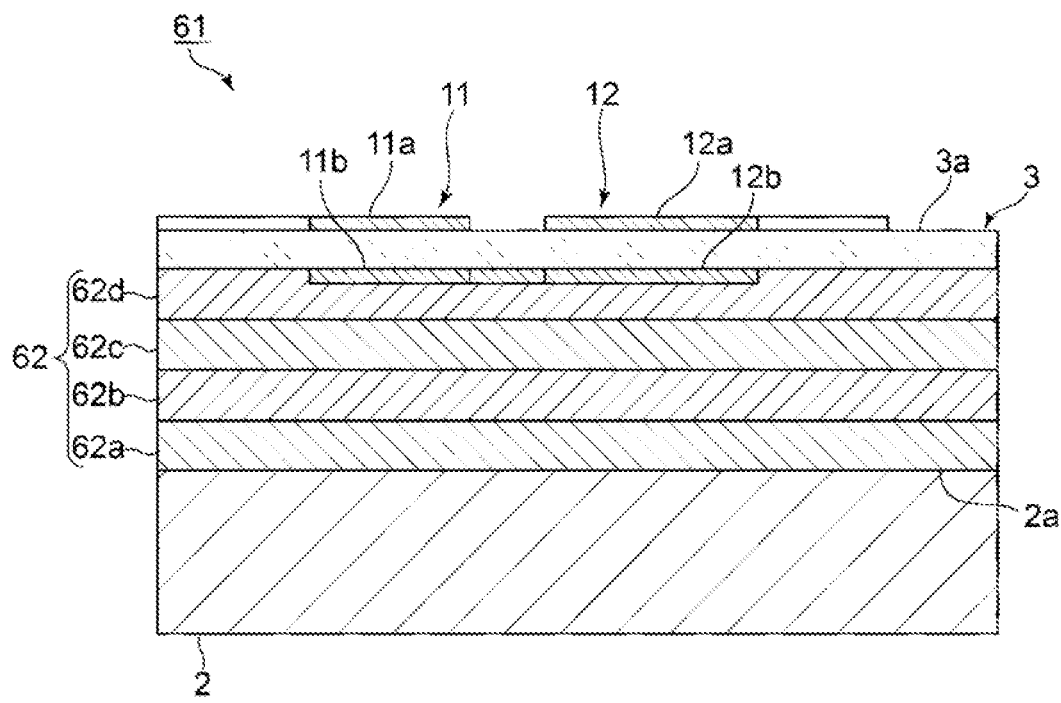
FIG. 14 is a front cross-sectional view of an acoustic wave device according to a sixth exemplary embodiment of the present disclosure.

FIG. 14 is a front cross-sectional view of an acoustic wave device according to a sixth exemplary embodiment of the present disclosure. In an acoustic wave device 61, an acoustic reflection film 62 is provided between the support substrate 2 and the piezoelectric film 3. The acoustic reflection film 62 has a structure in which a high acoustic impedance layer 62a having a relatively high acoustic impedance, a low acoustic impedance layer 62b having a relatively low acoustic impedance, a high acoustic impedance layer 62c, and a low acoustic impedance layer 62d are laminated in this order. Since the acoustic reflection film 62 is provided, the energy of the bulk wave as the acoustic wave is effectively confined in the piezoelectric film 3. That is, the acoustic reflection film 62 like this may be used as the energy confinement portion. The other structures of the acoustic wave device 61 are similar to those of the acoustic wave device 1. Therefore, in the acoustic wave device 61 as well, ripples appearing in the filter characteristics are less likely to occur. Note that the number of films of the acoustic reflection film 62 is not limited to four as illustrated in FIG. 14. The acoustic reflection film 62 may include one or more low acoustic impedance layers and one or more high acoustic impedance layers.

Figure 15:
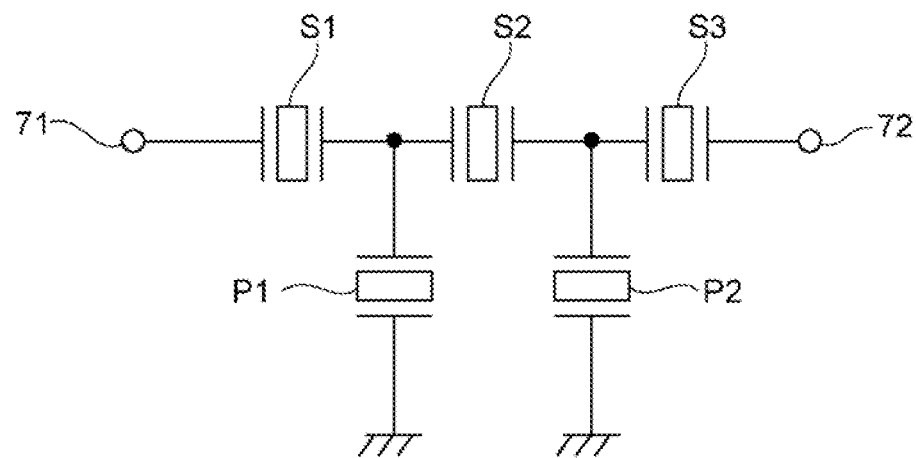
FIG. 15 is a circuit diagram of an acoustic wave device according to a seventh exemplary embodiment of the present disclosure.

FIG. 15 is a circuit diagram of an acoustic wave device according to a seventh exemplary embodiment. In this example, a ladder filter including series-arm resonators S1 to S3 and parallel-arm resonators P1 and P2 is formed. In the series-arm connecting an input terminal 71 and an output terminal 72, here, the series-arm resonator S1 and the series-arm resonator S2 are formed by the first and second resonators according to the present disclosure.

Figure 16:
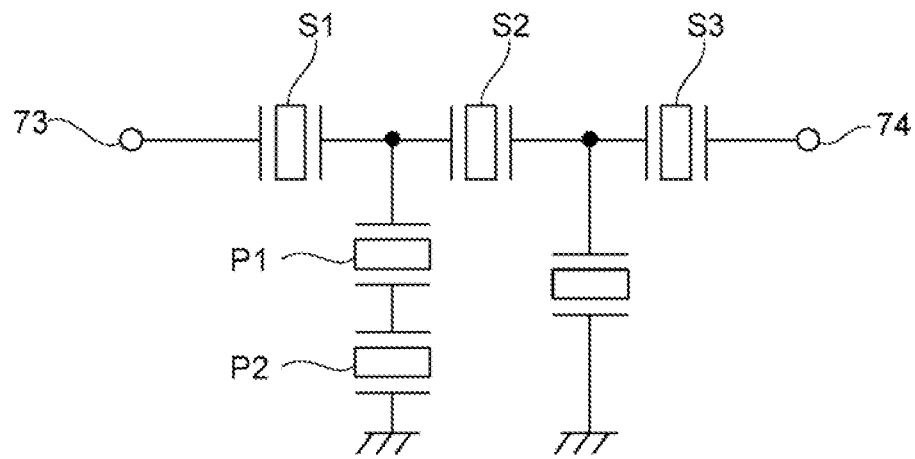
FIG. 16 is a circuit diagram of an acoustic wave device according to an eighth exemplary embodiment of the present disclosure.

FIG. 16 is a circuit diagram of an acoustic wave device according to an eighth exemplary embodiment. In this acoustic wave device, the series-arm resonators S1 to S3 are provided in the series-arm connecting an input terminal 73 and an output terminal 74. The parallel-arm resonators P1 and P2 are connected in series with each other between a connection point between the series-arm resonator S1 and the series-arm resonator S2 and the ground potential. The parallel-arm resonators P1 and P2 are formed as the first and second resonators according to the present disclosure.

Figure 17:
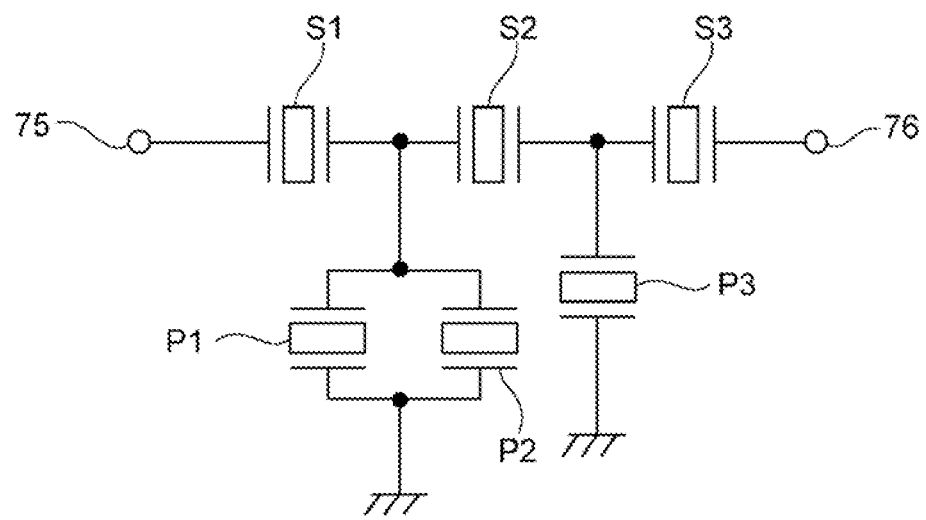
FIG. 17 is a circuit diagram of an acoustic wave device according to a ninth exemplary embodiment of the present disclosure.

FIG. 17 is a circuit diagram of an acoustic wave device according to a ninth exemplary embodiment. Also in this acoustic wave device, the series-arm resonators S1 to S3 are provided in the series-arm connecting an input terminal 75 and an output terminal 76. The parallel-arm resonators P1 and P2 connected in parallel are connected between a connection point between the series-arm resonator S1 and the series-arm resonator S2 and the ground potential. A parallel-arm resonator P3 is connected between the ground potential and a connection point between the series-arm resonator S2 and the series-arm resonator S3. The parallel-arm resonators P1 and P2 are formed by the first and second resonators according to the present disclosure.

Figure 18:
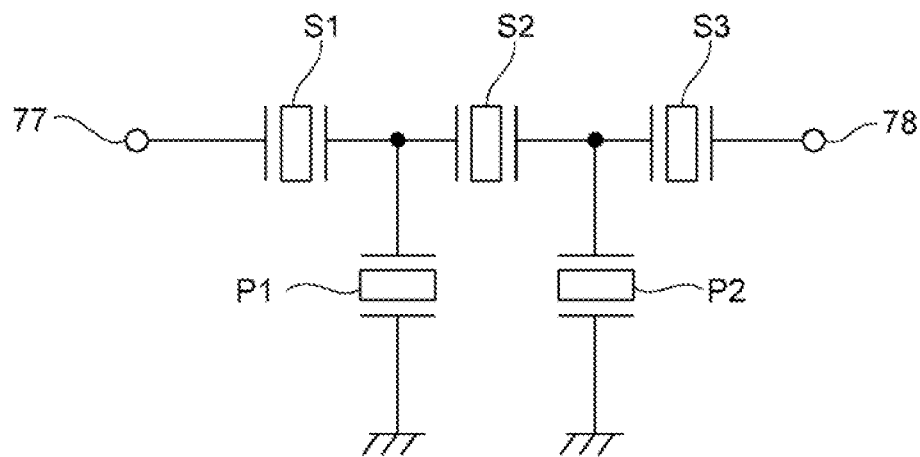
FIG. 18 is a circuit diagram of an acoustic wave device according to a tenth exemplary embodiment of the present disclosure.

FIG. 18 is a circuit diagram of an acoustic wave device according to a tenth exemplary embodiment. The series-arm resonators S1 to S3 are provided in the series-arm connecting an input terminal 77 and an output terminal 78. The parallel-arm resonator P1 is connected between the ground potential and the connection point between the series-arm resonators S1 and S2. The parallel-arm resonator P2 is connected between the ground potential and a connection point between the series-arm resonator S2 and the series-arm resonator S3. In the exemplary embodiment, the series-arm resonator S1 and the parallel-arm resonator P2 are formed as the above first and second resonators.

As illustrated in FIG. 15 to FIG. 18, in the present disclosure, at least two of the series-arm resonator and the parallel-arm resonator in the ladder filter may be formed as the first and second resonators, and the positions of the first and second resonators are not particularly limited.

Note that although the ladder filter is illustrated in FIG. 7, FIG. 10, and FIG. 15 to FIG. 18, the acoustic wave device according to the present disclosure is also applicable to an acoustic wave filter including a plurality of resonators other than the ladder filter.

REFERENCE SIGNS LIST

1 ACOUSTIC WAVE DEVICE
2 SUPPORT SUBSTRATE
2a UPPER SURFACE
2b THROUGH-HOLE
2c CONCAVE PORTION
3 PIEZOELECTRIC FILM
3a, 3b FIRST AND SECOND MAIN SURFACES
4 INPUT TERMINAL
5 OUTPUT TERMINAL
11 FIRST RESONATOR
11a, 11b FIRST AND SECOND ELECTRODES
11c FIRST EXCITATION PORTION
11d WIRING PORTION
12 SECOND RESONATOR
12a, 12b THIRD AND FOURTH ELECTRODES
12c SECOND EXCITATION PORTION
12d WIRING PORTION
13 THIRD RESONATOR
13a, 13b FIFTH AND SIXTH ELECTRODES
13c THIRD EXCITATION PORTION
14, 15, 16 FOURTH, FIFTH, AND SIXTH RESONATORS
21 ACOUSTIC WAVE DEVICE
22 INPUT TERMINAL
23 OUTPUT TERMINAL
24, 25 WIRING PORTION
24a, 25a CONNECTING PORTION
31 ACOUSTIC WAVE DEVICE
32 INPUT TERMINAL
33 OUTPUT TERMINAL
51, 61 ACOUSTIC WAVE DEVICE
62 ACOUSTIC REFLECTION FILM
62a HIGH ACOUSTIC IMPEDANCE LAYER
62b LOW ACOUSTIC IMPEDANCE LAYER
62c HIGH ACOUSTIC IMPEDANCE LAYER
62d LOW ACOUSTIC IMPEDANCE LAYER
71, 73, 75, 77 INPUT TERMINAL
72, 74, 76, 78 OUTPUT TERMINAL
101 FIRST RESONATOR
101a, 101b FIRST AND SECOND ELECTRODES
101c FIRST EXCITATION PORTION
102 SECOND RESONATOR
102a, 102b THIRD AND FOURTH ELECTRODES
102c SECOND EXCITATION PORTION
C VIA-HOLE ELECTRODE
L1 LENGTH DIRECTION
L2 LENGTH DIRECTION
P1 to P3 PARALLEL-ARM RESONATOR
S1 to S3 SERIES-ARM RESONATOR

The invention claimed is:

1. An acoustic wave device comprising:
a support substrate;
first and second resonators provided above the support substrate; and
an energy confinement portion provided between the support substrate and the first resonator or between the support substrate and the second resonator,
wherein the first resonator includes:
a first piezoelectric film including a first main surface facing a second main surface, the first and second main surfaces having anisotropy,
a first electrode provided on the first main surface or the second main surface, and a second electrode provided on the first main surface or the second main surface, the second resonator includes:
a second piezoelectric film including a third main surface facing a fourth main surface, the third and fourth main surfaces having anisotropy,
a third electrode provided on the third main surface or the fourth main surface, and a fourth electrode provided on the third main surface or the fourth main surface, in the first resonator, a first excitation portion is one of a portion in which the first electrode overlaps the second electrode via the first piezoelectric film and a portion in which the first electrode faces the second electrode on the first main surface or the second main surface, in the second resonator, a second excitation portion is another of a portion in which the third electrode overlaps the fourth electrode via the second piezoelectric film and a portion in which the third electrode faces the fourth electrode on the third main surface or the fourth main surface, and the first excitation portion and the second excitation portion each have a shape including a length direction in a plan view, and a length direction of the first excitation portion is different from a length direction of the second excitation portion, wherein the first main surface and the second main surface of the first piezoelectric film and the third main surface and the fourth main surface of the second piezoelectric film are planar throughout an entire surface thereof.

2. The acoustic wave device according to claim 1, wherein the first piezoelectric film and the second piezoelectric film are made of a same piezoelectric film.

3. The acoustic wave device according to claim 1, wherein a direction of a polarization axis of the first piezoelectric film in the first resonator differs from a direction of a polarization axis of the second piezoelectric film in the second resonator.

4. The acoustic wave device according to claim 1, wherein the first and second piezoelectric films are made of lithium tantalate or lithium niobate.

5. The acoustic wave device according to claim 1, wherein the first resonator and the second resonator are connected in series.

6. The acoustic wave device according to claim 5, wherein the first resonator and the second resonator are resonators formed by dividing a single resonator in series.

7. The acoustic wave device according to claim 1, wherein the first resonator and the second resonator are connected in parallel.

8. The acoustic wave device according to claim 1, wherein the energy confinement portion is a concave portion or a through-hole formed in a surface on a side of the support substrate on which the first and second resonators are provided.

9. The acoustic wave device according to claim 1, wherein the energy confinement portion includes an acoustic reflection film, and the acoustic reflection film includes a high acoustic impedance layer having a high acoustic impedance relative to a low acoustic impedance layer.

10. The acoustic wave device according to claim 1, wherein an acoustic wave filter includes a plurality of resonators, at least two resonators among the plurality of resonators being the acoustic wave device.

11. The acoustic wave device according to claim 10, wherein the plurality of resonators includes a plurality of series-arm resonators and a plurality of parallel-arm resonators to form a ladder filter.

12. An acoustic wave device comprising:
a support substrate;
first and second resonators provided above the support substrate; and
an energy confinement portion provided between the support substrate and the first resonator or between the support substrate and the second resonator, wherein the first resonator includes:
a first piezoelectric film including a first main surface facing a second main surface, the first and second main surfaces having anisotropy,
a first electrode provided on the first main surface or the second main surface, and
a second electrode provided on the first main surface or the second main surface, the second resonator includes:
a second piezoelectric film including a third main surface facing a fourth main surface, the third and fourth main surfaces having anisotropy,
a third electrode provided on the third main surface or the fourth main surface, and
a fourth electrode provided on the third main surface or the fourth main surface, in the first resonator, a first excitation portion is one of a portion in which the first electrode overlaps the second electrode via the first piezoelectric film and a portion in which the first electrode faces the second electrode on the first main surface or the second main surface, in the second resonator, a second excitation portion is another of a portion in which the third electrode overlaps the fourth electrode via the second piezoelectric film and a portion in which the third electrode faces the fourth electrode face each other on the third main surface or the fourth main surface, and at least one of a planar shape and an electrode structure of the first excitation portion is different from at least one of a planar shape and an electrode structure of the second excitation portion, which is not included the case where the planar shapes are different due to difference the aspect ratio.

13. The acoustic wave device according to claim 12, wherein the first piezoelectric film and the second piezoelectric film are made of a same piezoelectric film.

14. The acoustic wave device according to claim 12, wherein a direction of a polarization axis of the first piezoelectric film in the first resonator differs from a direction of a polarization axis of the second piezoelectric film in the second resonator.

15. The acoustic wave device according to claim 12, wherein the first and second piezoelectric films are made of lithium tantalate or lithium niobate.

16. The acoustic wave device according to claim 12, wherein the first resonator and the second resonator are connected in series, and
wherein the first resonator and the second resonator are resonators formed by dividing a single resonator in series.

17. The acoustic wave device according to claim 12, wherein the first resonator and the second resonator are connected in parallel.

18. The acoustic wave device according to claim 12, wherein the energy confinement portion is a concave portion or a through-hole formed in a surface on a side of the support substrate on which the first and second resonators are provided.

19. The acoustic wave device according to claim 12, wherein the energy confinement portion includes an acoustic reflection film, and the acoustic reflection film includes a high acoustic impedance layer having a high acoustic impedance relative to a low acoustic impedance layer.

20. The acoustic wave device according to claim 12, wherein an acoustic wave filter includes a plurality of resonators, at least two resonators among the plurality of resonators being the acoustic wave device, and wherein the plurality of resonators includes a plurality of series-arm resonators and a plurality of parallel-arm resonators to form a ladder filter.

\* \* \* \* \*